US008987985B2

(12) United States Patent
So

(10) Patent No.: US 8,987,985 B2
(45) Date of Patent: Mar. 24, 2015

(54) METHOD AND APPARATUS FOR LIGHT EMISSION UTILIZING AN OLED WITH A MICROCAVITY

(75) Inventor: Franky So, Gainesville, FL (US)

(73) Assignee: University of Florida Foundation, Inc., Gainsville, FL (US)

( * ) Notice: Subject to any disclaimer, the term of this patent is extended or adjusted under 35 U.S.C. 154(b) by 386 days.

(21) Appl. No.: 12/100,316

(22) Filed: Apr. 9, 2008

(65) Prior Publication Data

US 2008/0238308 A1    Oct. 2, 2008

Related U.S. Application Data

(63) Continuation-in-part of application No. PCT/US2006/040748, filed on Oct. 16, 2006.

(60) Provisional application No. 60/726,865, filed on Oct. 14, 2005.

(51) Int. Cl.
*H01L 51/52* (2006.01)
*H01L 51/50* (2006.01)

(52) U.S. Cl.
CPC ........ *H01L 51/5036* (2013.01); *H01L 51/5265* (2013.01)
USPC ............................ 313/501; 313/504; 313/506

(58) Field of Classification Search
USPC ............... 257/40, 72, 98–100, 642–643, 759; 313/498–512; 315/169.1, 169.3; 427/58, 64, 66, 532–535, 539; 428/690–691, 917; 438/26–29, 34, 82; 445/24–25
See application file for complete search history.

(56) References Cited

U.S. PATENT DOCUMENTS

| 5,982,092 | A | * | 11/1999 | Chen | 313/512 |
| 6,046,465 | A | * | 4/2000 | Wang et al. | 257/98 |
| 6,121,068 | A | * | 9/2000 | Ramdani et al. | 438/39 |
| 6,326,224 | B1 | | 12/2001 | Xu et al. | |
| 6,406,801 | B1 | * | 6/2002 | Tokito et al. | 428/690 |
| 6,621,211 | B1 | * | 9/2003 | Srivastava et al. | 313/503 |
| 6,791,259 | B1 | | 9/2004 | Stokes et al. | |
| 6,800,999 | B1 | * | 10/2004 | Duggal et al. | 315/169.1 |
| 7,057,339 | B2 | * | 6/2006 | Boroson et al. | 313/504 |
| 7,180,238 | B2 | * | 2/2007 | Winters | 313/506 |
| 2002/0175619 | A1 | * | 11/2002 | Kita et al. | 313/504 |

(Continued)

OTHER PUBLICATIONS

D'Andrade, B. W., et al., "White Organic Light-Emitting Devices for Solid-State Lighting," *Advanced Materials*, 2004, pp. 1585-1595, vol. 16, No. 18.

(Continued)

*Primary Examiner* — Donald Raleigh
(74) *Attorney, Agent, or Firm* — Wolf, Greenfield & Sacks, P.C.

(57) ABSTRACT

Provided is an OLED device and method of making the OLED device. According to an embodiment, the OLED device incorporates a microcavity structure including a dielectric mirror formed on a glass substrate, an anode formed above the dielectric mirror, an organic film layer formed above the anode, and a reflective electrode formed above the organic film layer such that the cavity is formed in the organic film layer by the dielectric mirror and the reflective electrode. The OLED device with microcavity structure can incorporate one or more phosphors deposited on an underside of the glass substrate such that light of additional wavelengths can be generated by the OLED device.

47 Claims, 8 Drawing Sheets

(56) References Cited

U.S. PATENT DOCUMENTS

| | | | |
|---|---|---|---|
| 2003/0209714 A1 | 11/2003 | Taskar et al. | |
| 2004/0021425 A1* | 2/2004 | Foust et al. | 315/169.3 |
| 2004/0061107 A1* | 4/2004 | Duggal | 257/40 |
| 2004/0121184 A1* | 6/2004 | Thompson et al. | 428/690 |
| 2004/0183963 A1* | 9/2004 | Nakamura et al. | 349/69 |
| 2004/0212296 A1* | 10/2004 | Nakamura et al. | 313/504 |
| 2004/0251818 A1* | 12/2004 | Duggal et al. | 313/504 |
| 2005/0046336 A1* | 3/2005 | Utsumi et al. | 313/501 |
| 2005/0058852 A1 | 3/2005 | Tyan et al. | |
| 2005/0088083 A1* | 4/2005 | Seo et al. | 313/504 |
| 2005/0121666 A1* | 6/2005 | Kondakova et al. | 257/40 |
| 2005/0196638 A1* | 9/2005 | Son et al. | 428/690 |
| 2005/0225232 A1* | 10/2005 | Boroson et al. | 313/504 |
| 2005/0225233 A1* | 10/2005 | Boroson et al. | 313/504 |
| 2006/0006795 A1* | 1/2006 | Strip | 313/504 |
| 2006/0099448 A1* | 5/2006 | Lu et al. | 428/690 |
| 2006/0158098 A1* | 7/2006 | Raychaudhuri et al. | 313/503 |
| 2006/0163998 A1* | 7/2006 | Tiberi et al. | 313/477 R |
| 2006/0175961 A1* | 8/2006 | Choong | 313/506 |
| 2006/0197437 A1* | 9/2006 | Krummacher et al. | 313/501 |
| 2006/0246811 A1* | 11/2006 | Winters et al. | 445/25 |
| 2006/0251919 A1* | 11/2006 | Aziz et al. | 428/690 |
| 2006/0251922 A1* | 11/2006 | Liao et al. | 428/690 |
| 2006/0251923 A1* | 11/2006 | Lin et al. | 428/690 |
| 2006/0269656 A1* | 11/2006 | Boroson et al. | 427/66 |
| 2007/0034864 A1* | 2/2007 | Liu | 257/40 |
| 2007/0087219 A1* | 4/2007 | Ren et al. | 428/690 |
| 2007/0271808 A9* | 11/2007 | Wang et al. | 34/72 |
| 2008/0259987 A1* | 10/2008 | Smith | 372/80 |

OTHER PUBLICATIONS

Duggal, A., et al., "Organic Light-Emitting Devices for Illumination Quality White Light," *Applied Physics Letters*, May 13, 2002, pp. 3470-3472, vol. 80, No. 19.

Steigerwald, D. A., et al., "Illumination With Solid State Lighting Technology," *IEEE Journal of Selected Topics in Quantum Electronics*, Mar./Apr. 2002, pp. 310-320, vol. 8, No. 2.

High Efficiency Nitride-Based Solid State Lighting summary and press release, University of California at Santa Barbara, 2005 Project Portfolio: Solid State Lighting, Jan. 2005.

* cited by examiner

Light

Non-cavity device

Cavity device

| ITO, 50 nm |
| --- |
| TiO$_2$, n=2.45, 56 nm |
| SiO$_2$, n=1.5, 92 nm |
| TiO$_2$, n=2.45, 56 nm |
| SiO$_2$, n=1.5, 92 nm |
| TiO$_2$, n=2.45, 56 nm |
| Glass Substrate |

METHOD AND APPARATUS FOR LIGHT EMISSION UTILIZING AN OLED WITH A MICROCAVITY

CROSS-REFERENCE TO RELATED APPLICATIONS

This application is a continuation-in-part of International Patent Application No. PCT/US2006/040748, filed Oct. 16, 2006, which claims the benefit of U.S. Provisional Patent Application Ser. No. 60/726,865, filed Oct. 14, 2005, the disclosures of which are hereby incorporated by reference herein in their entirety.

BACKGROUND OF INVENTION

Organic light emitting diodes (OLEDs) have the potential of being used in solid state lighting to replace conventional light sources such as incandescent light sources. The traditional light sources have efficiencies lower than 15 lm/W, where OLED have the potential of reaching 100 lm/W. Potential uses for OLEDs include lighting products, backlights for LCD panels, and flat panel displays.

A typical OLED device structure is shown in FIG. 1. The device has multilayer organic films sandwiched between a metal cathode 10 and an indium tin oxide transparent electrode 20. Typically, a hole transporting layer 11 is deposited on the top of an ITO electrode 20 followed by the deposition of an emitting layer 12. Additional layers are sometimes added to the device structure to enhance the performance. One of the issues with OLEDs is that about 80% of the light generated by the device is trapped within the glass substrate 1 and only about 20% of the light can get out.

BRIEF SUMMARY

Embodiments of the present invention pertain to an organic light emitting diode (OLED) device and method for producing light of one or more desired wavelengths. An embodiment relates to a method for manufacturing an OLED for producing light of one or more desired wavelengths. An embodiment of an OLED device is capable of providing an enhanced light coupling efficiency. An additional embodiment of an OLED device is capable of providing a broad color spectrum.

In a specific embodiment, an OLED device incorporates a dielectric mirror formed on a glass substrate; an anode formed above the dielectric mirror; an organic film layer formed above the anode; a reflective electrode formed above the organic film layer, wherein a cavity is formed in the organic film layer by the dielectric mirror and the reflective electrode; a cathode formed above the reflective electrode; and one or more phosphors deposited on an underside of the glass substrate.

In another aspect of the present invention, there is provided a method for manufacturing an OLED device, including: forming a dielectric mirror on a glass substrate; forming an indium-tin-oxide (ITO) layer above the dielectric layer; growing organic layers above the ITO layer; forming a metal cathode layer, including a reflective electrode above the organic layers; and coating an underside of the glass substrate with one or more phosphors.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

DETAILED DISCLOSURE

Embodiments of the present invention pertain to an organic light emitting diode (OLED) device and method for producing light of one or more desired wavelengths. An embodiment relates to a method for manufacturing an OLED for producing light of one or more desired wavelengths. An embodiment of an OLED device is capable of providing an enhanced light coupling efficiency. An additional embodiment of an OLED device is capable of providing a broad color spectrum.

Figure 1:
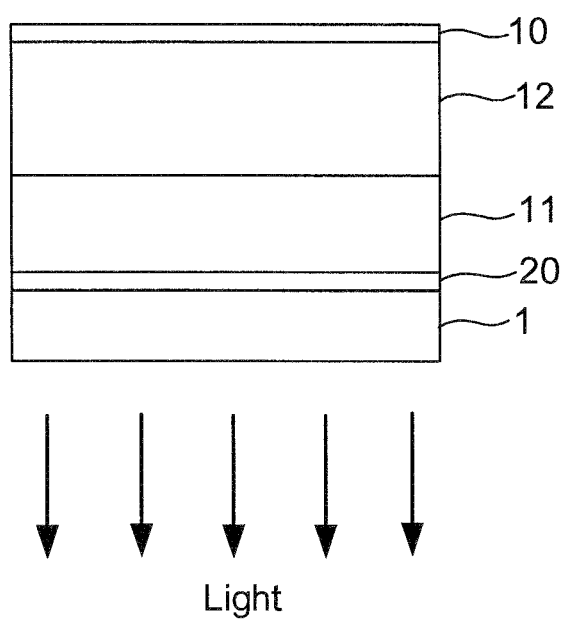
FIG. 1 shows a typical OLED structure.
Figure 2A:
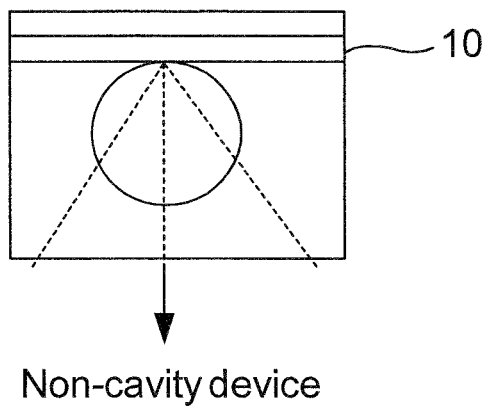
FIG. 2 shows a comparison between an OLED device without a microcavity and an OLED structure with a microcavity.
Figure 2B:
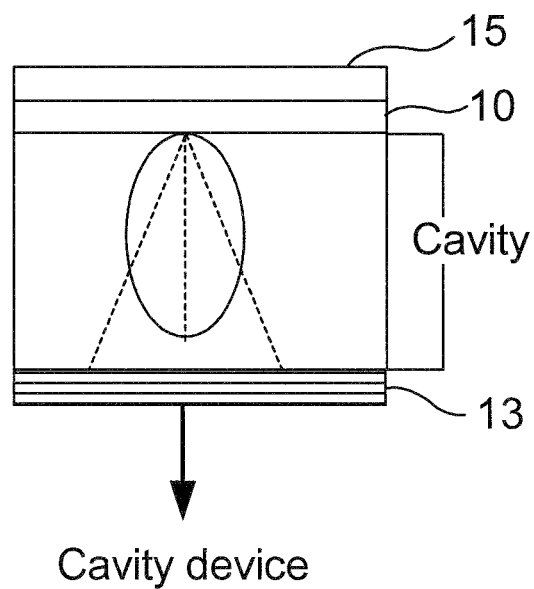

Embodiments of the subject invention can include a blue light emitting organic LED (OLED) structure incorporating a microcavity structure to partially reflect the light generated in the OLED structure back into the OLED structure, so as to create a cavity effect within the device to enhance the output from the OLED. In an embodiment, the microcavity can be created with a reflective material on one end of the OLED and a reflective material at the other end of the OLED. FIG. 2B shows an electrode 10 and a reflective layer 15 at one end of the OLED. The electrode 10 and reflective layer 15 can be reversed in position and/or be accomplished with a single layer, such as a layer of reflective metal as the electrode. Likewise, the other end of the OLED can have an electrode and a reflective layer, in either order of position, or have a single layer accomplish both reflection and function as an electrode. In an embodiment similar to the embodiment as shown in FIG. 2B, a dielectric mirror 13 can be used at one end of the OLED and a reflective electrode 15 can be used at the other end. Such a dielectric mirror can be referred to as a half mirror and, in an embodiment, can incorporate a quarter wave stack of dielectric thin films.

Figure 3:
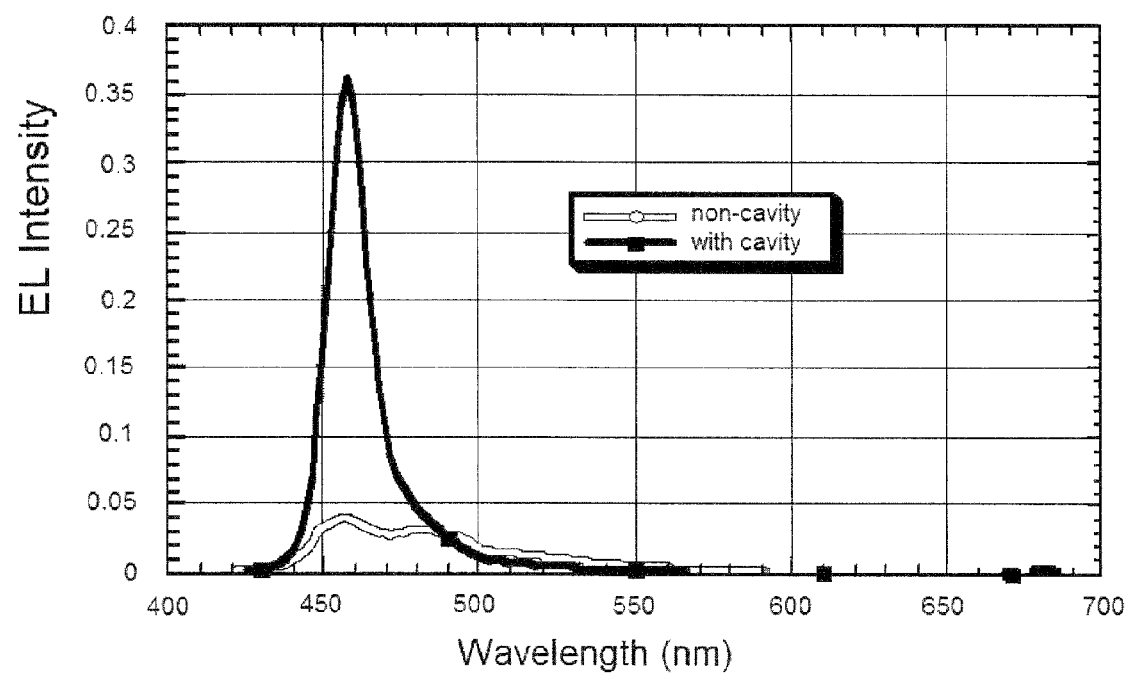
FIG. 3 shows a comparison of the output spectrum of an OLED device without a microcavity and an OLED structure with a microcavity.
Figures 5, 6:
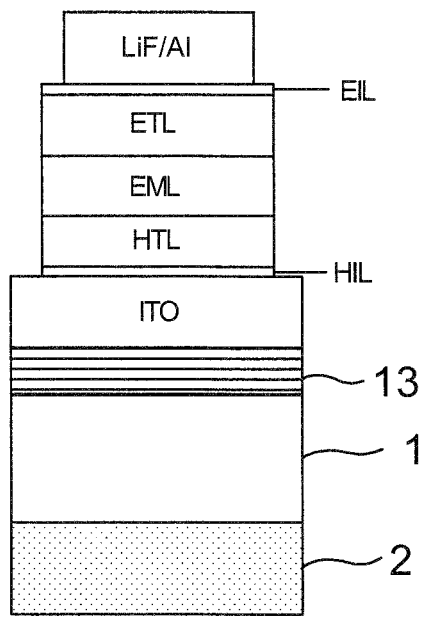
FIG. 5 shows the structure of a specific embodiment of the subject invention.
FIG. 6 shows the structure of a specific embodiment of a dielectric mirror on a glass substrate, with an ITO layer, which can be utilized with the embodiment shown in FIG. 5.

Referring to FIG. 5, in an embodiment, a dielectric mirror 13 can be deposited on a glass substrate 1 prior to deposition of an indium-tin-oxide (ITO) electrode. The dielectric mirror can allow for partial transmission and partial reflection of light generated within the device. By proper tuning on the cavity length, the wavelength of the reflected light can be selected, thus creating a cavity effect within the device. Because of the wavelength selectivity of the reflected light, the resonance within the cavity enhances light coupling efficiency, resulting in enhancement in light output. Typical enhancement of light output can vary between a factor of 3 and a factor of 6. FIG. 3 shows the enhancement of light output for a specific embodiment of an OLED in accordance with the invention.

To generate light having a broader color spectrum, such as, for example, white light, from the blue emitting device, one or more phosphors can be placed such that the blue light from the OLED device passes through the phosphor material and causes light of additional wavelengths to be generated. Various embodiments of the invention can incorporate one or more phosphors having colors selected from, but not limited to, red, green, yellow, and orange. In a specific embodiment, a film of yellow phosphor material can be deposited on the substrate glass. Blue light coming out of the glass substrate can excite the phosphors and generate yellow light. In an embodiment, the blue light coming out of the glass substrate can have a wavelength in the range of about 430 nm to about 500 nm. By proper mixture of blue and yellow light, a high efficiency white source can be generated. The phosphor materials can be inorganic phosphors or organic phosphors. Inorganic phosphor particle matter tend to scatter light more and provide a more uniform light emitting devices while organic phosphors tend to give a more directional light sources.

Figure 4:
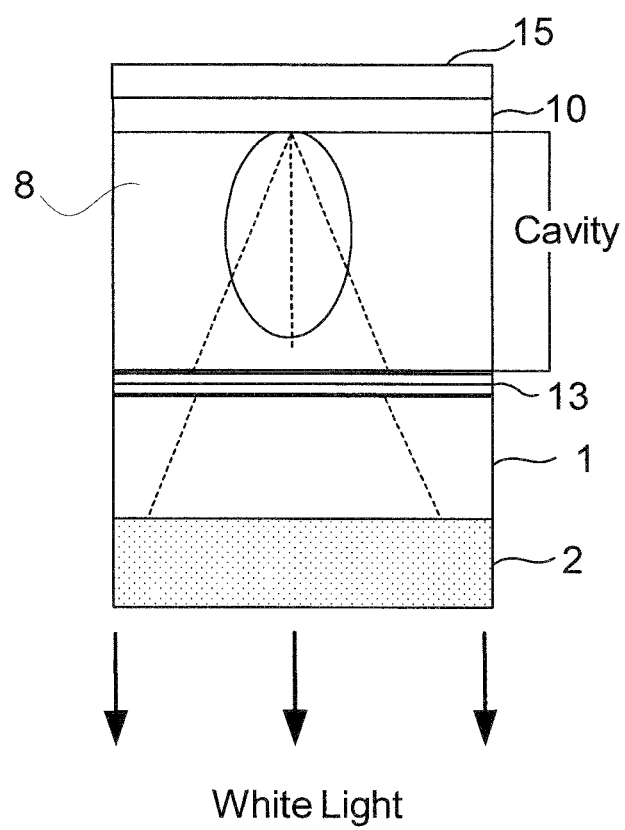
FIG. 4 shows a schematic of the operation of a specific embodiment of the subject invention.

FIG. 4 shows a schematic of the operation of a specific embodiment of an OLED in accordance with the subject invention. The subject OLED can incorporate the cavity device of FIG. 2, a glass substrate 1, and a phosphor coating 2. In one embodiment, a blue light emitting microcavity OLED can be used where the blue light can be down converted to white light using yellow phosphors. In operation, blue light coming out of the glass substrate 1 can excite the yellow phosphors in the phosphor coating 2 to generate a white light.

Referring to FIG. 5, a specific embodiment of the invention is shown. Fabrication of the device shown in FIG. 5 can begin with a glass substrate 1. An OLED can be grown on the glass substrate. Prior to growing the OLED, a dielectric mirror 13 can be grown on the glass substrate 1. This dielectric mirror 13 structure is shown in further detail in FIG. 6. The substrates can be degreased with solvents and then cleaned by exposure to oxygen plasma and UV-ozone ambient. All organic and cathode metal layers can be grown in succession without breaking the vacuum.

Figure 9:
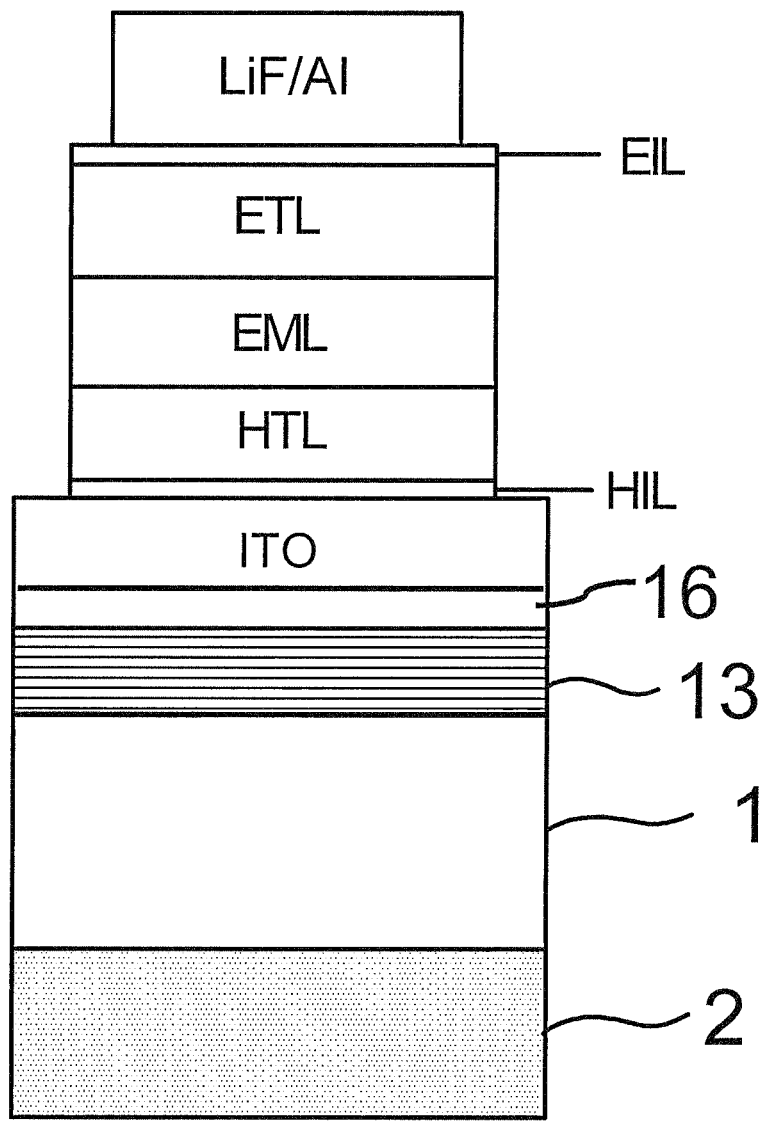
FIG. 9 shows the embodiment of FIG. 5, with a spacer layer between the dielectric mirror and the ITO layer.

The dielectric mirror 13 shown in FIG. 6 can be grown by alternating layers of $TiO_2$ (n=2.45) and $SiO_2$ (n=1.5). These alternating layers can create a Bragg-type reflector, such as a quarter-wave dielectric stack reflector. Other materials and structures can also he used to create the dielectric mirror. The resulting dielectric mirror structure shown in FIG. 6 has a peak reflectivity of about 80-95% over a range of wavelengths between 400 nm to 550 nm. In an embodiment, the peak reflectivity of the dielectric mirror is in the range between 70-95%, in a further embodiment in the range between 80-95%, in a further embodiment in the range between 80-90%. A silicon nitride layer can be used as a spacer layer prior to growing an ITO layer, which can be an electrode for the OLED. FIG. 9 shows the embodiment as shown in FIG. 5, with a spacer layer 16 between the dielectric mirror and the ITO layer. The thickness of the silicon nitride layer can be controlled to control the length of the cavity. By using such a spacer layer 16 that can have a variable thickness the thickness of the organic film layer can be held approximately constant for devices having different cavity lengths. In this way, the operating voltage of the devices can be approximately the same while the wavelength varies from device to device. Referring back to FIG. 5, organic layers can then be grown on the ITO layer to create the OLED. Although a variety of materials can be utilized for the organic layers, in a specific embodiment shown in FIG. 5, these organic layers include the following:

EIL, electron injection layer: Cs doped into a matrix of 4,7-diphenyl-1,10-phenanthroline (BPhen)

ETL, electron transport layer: 4-biphenyloxolato Aluminum (bis~2-methyl-8-quinolinato)4-phenylphenolate (BAlq)

EML, emissive layer: host4 N,N8-dicarbazolyl-3,5-benzene (mCP) doped with phosphorescent iridium complex iridium(III)bis[(4,6-Difluorophenyl)-pyridinato-N,C2']picolinate (FIrpic)

HTL, Hole transport layer: 4-4'-bis[N-(1-naphthyl)-N-phenyl-amino]biphenyl (a-NPD)

HIL, hole injection layer, zinc phthalocyanine (ZnPc) doped with 2,3,5,6-tetrafluoro-7,7,8,8-tetracyanoquinodimethane ($F_4$-TCNQ)

To fabricate the device, first, a 10-nm-thick zinc phthalocyanine as a hole injection layer and a 30-nm-thick NPD hole transport layer were deposited. Next, 6% FIrpic by weight was codeposited with either mCP to form the 30-nm-thick emissive layer. Finally, a 40-nm-thick electron transport layer of BAlq is deposited and used to block holes and confine excitons in the emissive zone. A 30 nm thick EIL consisting of Cs coevaporated with BPhen is deposited. Cathodes consisting of a 1-nm-thick layer of LiF followed by a 100-nm-thick layer of Al were deposited (note that FIG. 5 does not show the LiF layer separately). Other metals can be used for this cathode layer. The metal cathode also functions as an end mirror for the microcavity. All organic and cathode metal layers can be grown in succession without breaking the vacuum.

Figure 7:
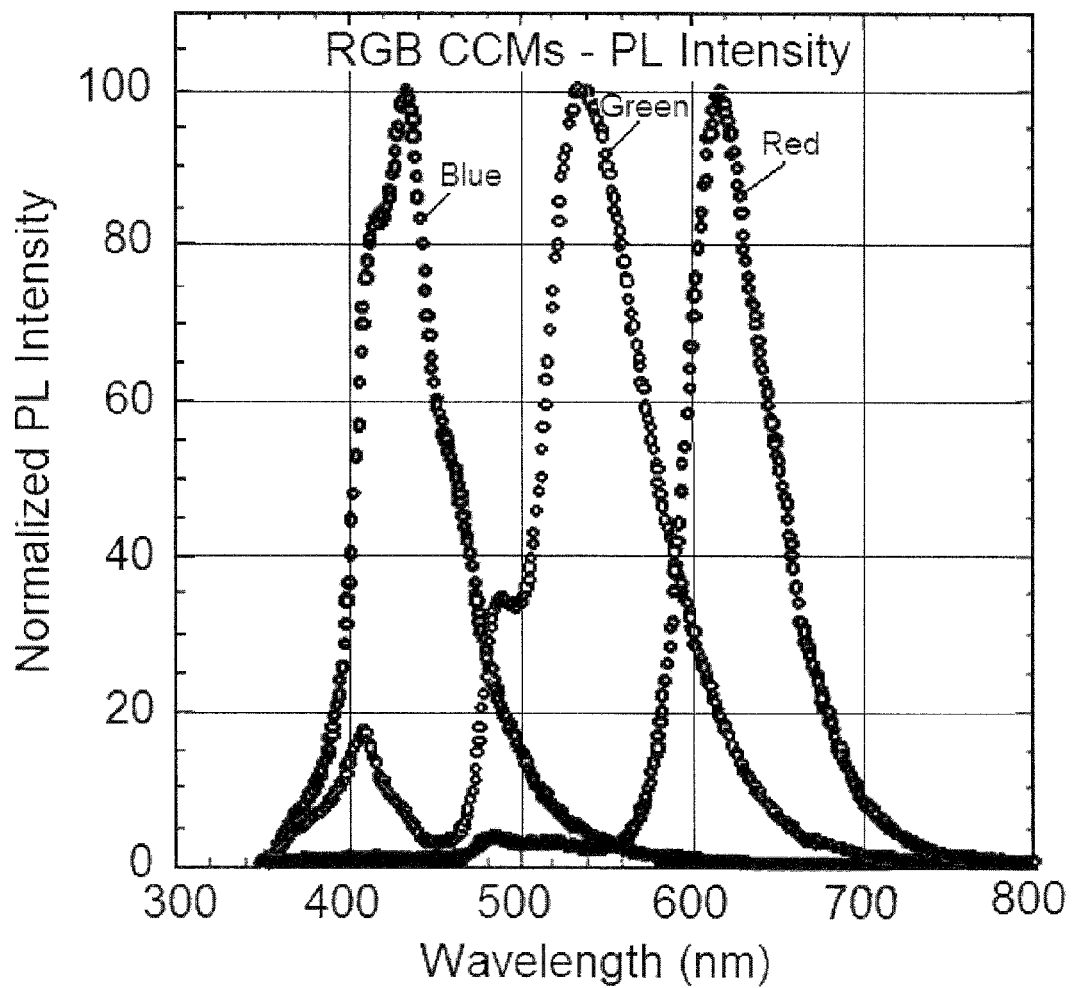
FIG. 7 shows the emission spectra for perylene red, green, and blue.

The phosphor coating 2 on the underside of the glass substrate 1 can utilize one or more phosphors, such as organic phosphors and inorganic phosphors. In an embodiment, the phosphor film thickness can range from about 1 micron to about 50 microns. Inorganic phosphors can be used in a polymer binder such as PMMA. Examples include YAG:Ce ($Y_3Al_5O_{12}$:Ce) based phosphors, silicate or nitridosilicate phosphors, $A_2Si_5N_8$ (red-yellow emission) and $ASi_2O_2N_2$ (yellow-green emission where A is an alkaline earth element), and nano-particles of YAG:Ce and CdS:Mn/ZnS. Organic phosphors can be, for example, dissolved in a solvent or can be a polymer. Examples include perylene (3,9-perylenedicarboxylic acid, bis(2-methylpropyl) ester) red and perylene orange dispersed in a PMMA host. FIG. 7 shows emission spectra for perylene red, green, and blue (labeled accordingly).

Figure 8:
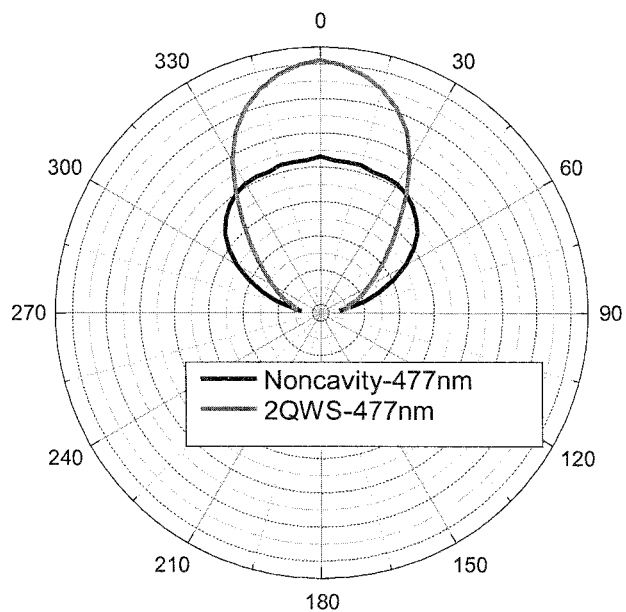
FIG. 8 shows a polar plot illustrating the light emission as a function of angles for an embodiment of the invention having a microcavity versus the device without a microcavity structure.

FIG. 8 provides a polar plot that shows the light emission as a function of angle for an embodiment of the subject invention having a microcavity versus the device without a microcavity. The total light emission is the area inside the "ellipse". The lower curve shows the light emission from a non-cavity device, and the upper curve shows the light emission from an embodiment incorporating a cavity device. The light emission is enhanced by more than 70% due to the microcavity.

Accordingly, as described above, an OLED including a microcavity structure is capable of emitting a colored light according to the length of the cavity at an enhanced efficiency by the cavity structure.

Also, according to the present invention, a broader color spectrum can be generated by the application of one or more phosphors to the OLED device, so that light from the OLED device passes through the one or more phosphors and causes light of additional wavelengths to be generated.

It will be apparent to those skilled in the art that various modifications and variations can be made in the present invention. Thus, it is intended that the present invention covers the modifications and variations of this invention provided they come within the scope of the appended claims and their equivalents.

All patents, patent applications, provisional applications, and publications referred to or cited herein are incorporated by reference in their entirety, including all figures and tables, to the extent they are not inconsistent with the explicit teachings of this specification. It should be understood that the examples and embodiments described herein are for illustrative purposes only and that various modifications or changes in light thereof will be suggested to persons skilled in the art and are to be included within the spirit and purview of this application.

What is claimed is:

1. A device for producing light, comprising:
    a first reflective layer formed above a first surface of a glass substrate;
    a first electrode formed above the first surface of the glass substrate;
    an organic film layer formed above the first electrode;
    a second electrode formed above the organic film layer;
    a second reflective layer formed above the organic film layer, wherein a cavity is formed by the first reflective layer and the second reflective layer such that light generated in the organic film layer within the cavity is reflected back into the cavity by the second reflective layer and partially reflected back into the cavity by the first reflective layer so as to create a cavity effect, wherein the cavity effect causes light having a desired wavelength to resonate within the cavity, wherein the desired wavelength is in the range of about 430 nm to about 500 nm; and
    a layer incorporating two or more phosphors below a second surface of the glass substrate,
    wherein a portion of the light from the cavity incident on the first reflective layer passes through the first reflective layer and passes through the glass substrate, wherein the light exiting the second surface of the glass substrate having the desired wavelength passes through the layer incorporating two or more phosphors, wherein a portion of the light having the desired wavelength exits the device as output light, wherein a portion of the light having the desired wavelength excites the two or more phosphors and causes light of two or more additional wavelengths to be generated as output light from the device, wherein a spacing between the first reflective layer and the second reflective layers is such that light having the desired wavelength resonates within the cavity, wherein the resonance within the cavity and the layer incorporating two or more phosphors below the second surface of the glass substrate enhance the intensity of the output light, wherein the output light from the device is substantially white.

2. The device according to claim 1, wherein the first reflective layer is formed on the first surface of the glass substrate.

3. The device according to claim 1, wherein the first reflective layer is the first electrode.

4. The device according to claim 1, wherein the second electrode is the second reflective layer.

5. The device according to claim 1, further comprising a spacer layer between the first reflective layer and the first electrode.

6. The device according to claim 5, wherein adjusting the thickness of the spacer layer changes the wavelength with respect to which the cavity effect is created.

7. The device according to claim 1, wherein the organic film layer comprises:
    a hole injection layer where holes are injected into;
    a hole transport layer formed on the hole injection layer, through which the injected holes travel;
    an emissive layer formed on the hole transport layer;
    an electron transport layer formed on the emissive layer; and
    an electron injection layer formed on the electron transport layer where electrons are injected, wherein injected electrons travel through the electron transport layer and recombine with the injected holes in the emissive layer to generate light in the cavity.

8. The device according to claim 7, wherein the hole injection layer comprises zinc phthalocyanine (ZnPc) doped with 2,3,5,6-tetrafluoro-7,7,8,8-tetracyanoquinodimethane ($F_4$-TCNQ),
    wherein the hole transport layer comprises 4-4'-bis[N-(1-naphthyl)-N-phenyl-amino]biphenyl (a-NPD),
    wherein the emissive layer comprises host4 N,N8-dicarbazolyl-3,5-benzene (mCP) doped with phosphorescent iridium complex iridium(III) bis[(4,6-Difluorophenyl)-pyridinato-N,C2']picolinate (FIrpic),
    wherein the electron transport layer comprises 4-biphenyloxolato Aluminum (bis~2-methyl-8-quinolinato) 4-phenylphenolate (BAlq), and
    wherein the electron injection layer is Cs doped into a matrix of 4,7-diphenyl-1,10-phenanthroline (BPhen).

9. The device according to claim 2, wherein the light exiting the second surface of the glass substrate passing through the two or more phosphors causes light having additional wavelengths associated with two or more colors selected from the group consisting of: red, green, yellow, and orange.

10. The device according to claim 1, wherein the two or more phosphors comprise at least one inorganic phosphor.

11. The device according to claim 10, wherein the inorganic phosphor uses a polymer binder, wherein the inorganic phosphor is selected from the group consisting of YAG:Ce ($Y_3Al_5O_{12}$:Ce) based phosphors, silicate or nitridosilicate phosphors, $A_2Si_5N_8$ (red-yellow emission) and $ASi_2O_2N_2$ (yellow-green emission where A is an alkaline earth element), and nano-particles of YAG:Ce and CdS:Mn/ZnS.

12. The device according to claim 1, wherein the two or more phosphors comprise at least one organic phosphor.

13. The device according to claim 12, wherein the organic phosphor is perylene (3,9-perylenedicarboxylic acid, bis(2-methylpropyl) ester) red or perylene orange dispersed in a PMMA host.

14. The device according to claim 1, wherein the first reflective layer comprises a stack of dielectric thin films.

15. The device according to claim 14, wherein the stack of dielectric thin films comprises an alternating stack of $TiO_2$ and $SiO_2$ layers to form a Bragg-type reflector.

16. A method of producing light, comprising:
    forming a first reflective layer above a first surface of a glass substrate;
    forming a first electrode above the first surface of the glass substrate;
    forming an organic film layer above the first electrode;
    forming a second reflective layer above the organic film layer, wherein a cavity is formed by the first reflective layer and the second reflective layer such that light generated in the organic film layer within the cavity is reflected back into the cavity by the second reflective layer and partially reflected back into the cavity by the first reflective layer so as to create a cavity effect, wherein the cavity effect causes light having a desired wavelength to resonate within the cavity, wherein the desired wavelength is in the range of about 430 nm to about 500 nm; and positioning a layer incorporating two or more phosphors below a second surface of the glass substrate, wherein a portion of the light from the cavity incident on the first reflective layer passes through the first reflective layer and passes through the glass substrate, wherein the light exiting the second surface of the glass substrate having the desired wavelength passes through the layer incorporating two or more phosphors, wherein a portion of the light having the desired wavelength exits the device as output light, wherein a portion of the light having the desired wavelength excites the two or more phosphors and causes light of two or more additional wavelengths to be generated as output light from the device, wherein the resonance within the cavity and positioning the layer incorporating two or more phosphors below the second surface of the glass substrate enhance the intensity of the output light, wherein the output light from the device is substantially white.

17. The method according to claim 16, wherein forming an organic film above the first electrode comprises:
    forming a hole injection layer above the first electrode;
    forming a hole transport layer on the hole injection layer;
    forming an emissive layer on the hole transport layer;
    forming an electron transport layer on the emissive layer; and
    forming an electron injection layer on the electron transport layer, wherein the holes are injected into the hole injection layer and travel through the hole transport layer, wherein electrons are injected into the electron injection layer and travel through the electron transport layer and recombine in the emissive layer with the holes to generate light in the cavity.

18. The method according to claim 16, wherein the second electrode is the second reflective material layer.

19. The method according to claim 16, wherein the first reflective layer is formed on the first surface of the glass substrate.

20. The method according to claim 16, wherein the first reflective layer is the first electrode.

21. The method according to claim 16, further comprising forming a spacer layer between the first reflective layer and the first electrode.

22. The method according to claim 21, further comprising adjusting the thickness of the spacer layer to change the desired wavelength with respect to which the cavity effect is created.

23. The method according to claim 17, wherein the hole injection layer comprises zinc phthalocyanine (ZnPc) doped with 2,3,5,6-tetrafluoro-7,7,8,8-tetracyanoquinodimethane ($F_4$-TCNQ),
    wherein the hole transport layer comprises 4-4'-bis [N-(1-naphthyl)-N-phenyl-amino]biphenyl (a-NPD),
    wherein the emissive layer comprises host4 N,N8-dicarbazolyl-3,5-benzene (mCP) doped with phosphorescent iridium complex iridium(III) bis[(4,6- Difluorophenyl)-pyridinato -N,C2']picolinate (Flrpic), wherein the electron transport layer comprises 4-biphenyloxolato Aluminum (bis-2-methyl-8-quinolinato)4-phenylphenolate (BAlq), and
    wherein the electron injection layer is Cs doped into a matrix of 4,7-diphenyl-1,10-phenanthroline (BPhen).

24. The method according to claim 16, wherein a spacing between the first reflective layer and the second reflective layer is such that light having the desired wavelength resonates within the cavity.

25. The method according to claim 19, wherein the light exiting the second surface of the glass substrate passing through the two or more phosphors causes light having additional wavelengths associated with two or more colors selected from the group consisting of: red, green, yellow, and orange.

26. The method according to claim 16, wherein the two or more phosphors comprise at least one inorganic phosphor.

27. The method according to claim 26, wherein the inorganic phosphor uses a polymer binder, wherein the inorganic phosphor is selected from the group consisting of YAG:Ce ($Y_3Al_5O_{12}$:Ce) based phosphors, silicate or nitridosilicate phosphors, $A_2Si_5N_8$ (red-yellow emission) and $ASi_2O_2N_2$ (yellow-green emission where A is an alkaline earth element), and nano-particles of YAG:Ce and CdS:Mn/ZnS.

28. The method according to claim 16, wherein the two or more phosphors comprise at least one organic phosphor.

29. The method according to claim 28, wherein the organic phosphor is perylene (3,9-perylenedicarboxylic acid, bis(2-methylpropyl) ester) red or perylene orange dispersed in a PMMA host.

30. The method according to claim 16, wherein the first reflective layer comprises a stack of dielectric thin films.

31. The method according to claim 30, wherein the stack of dielectric thin films comprises an alternating stack of $TiO_2$ and $SiO_2$ layers to form a Bragg-type reflector.

32. The method according to claim 16, wherein the light of two or more additional wavelengths comprises red and yellow light.

33. The device according to claim 1, wherein the light of two or more additional wavelengths comprises red and yellow light.

34. The device according to claim 1, wherein the resonance within the cavity and the layer incorporating two or more phosphors below the second surface of the glass substrate enhance the intensity of the output light between a factor of 3 and a factor of 6.

35. The method according to claim 16, wherein the resonance within the cavity and positioning the layer incorporating two or more phosphors below the second surface of the glass substrate enhance the intensity of the output light between a factor of 3 and a factor of 6.

36. The device according to claim 1, wherein the layer incorporating two or more phosphors is in contact with the second surface of the glass substrate.

37. The method according to claim 16, wherein the layer incorporating two or more phosphors is in contact with the second surface of the glass substrate.

38. The device according to claim 1, wherein the resonance within the cavity and the layer incorporating two or more phosphors below the second surface of the glass substrate enhance the intensity of the output light output between a factor of 2 and a factor of 6.

39. The method according to claim 16, wherein the resonance within the cavity and positioning the layer incorporating two or more phosphors below the second surface of the glass substrate enhance the intensity of the output light output between a factor of 2 and a factor of 6.

40. The device according to claim 1, wherein the two or more phosphors comprise three or more phosphors, wherein the two or more additional wavelengths are three or more wavelengths.

41. The method according to claim 16, wherein the two or more phosphors comprise three or more phosphors, wherein the two or more additional wavelengths are three or more wavelengths.

42. A device for producing white light, comprising:
a microcavity, comprising:
   a first reflective layer; and
   a second reflective layer; and
an organic light-emitting layer, wherein the organic light-emitting layer is positioned between the first reflective layer and the second reflective layer of the microcavity; and
a layer comprising two or more phosphors,
wherein the microcavity is tuned such that light emitted from the organic light-emitting layer having a first wavelength resonates within the microcavity, wherein the first wavelength is in the range of about 430 nm to about 500 nm, wherein a portion of light having the first wavelength exits the device as output light, wherein a portion of light having the first wavelength excites the two or more phosphors such that the two or more phosphors generate light having a two or more different wavelengths as output light, wherein the output light from the device is substantially white.

43. The device of claim 42, wherein the light having two or more different wavelengths comprises substantially yellow light, substantially green light, and/or substantially red light.

44. The device according to claim 42, wherein the two or more phosphors comprise three or more phosphors, wherein the two or more different wavelengths are three or more different wavelengths.

45. The device according to claim 42, wherein the first reflective layer comprises a stack of dielectric thin films.

46. The device according to claim 45, wherein the stack of dielectric thin films comprises an alternating stack of $TiO_2$ and $SiO_2$ layers to form a Bragg-type reflector.

47. The device according to claim 42, wherein resonance within the microcavity and the layer incorporating two or more phosphors enhance the intensity of the output light between a factor of 2 and a factor of 6.

* * * * *

UNITED STATES PATENT AND TRADEMARK OFFICE
CERTIFICATE OF CORRECTION

PATENT NO. : 8,987,985 B2  
APPLICATION NO. : 12/100316  
DATED : March 24, 2015  
INVENTOR(S) : Franky So Page 1 of 1

It is certified that error appears in the above-identified patent and that said Letters Patent is hereby corrected as shown below:

IN THE CLAIMS:

In Column 10, Line 3, please delete "a".

Signed and Sealed this
Fourteenth Day of July, 2015

Michelle K. Lee
*Director of the United States Patent and Trademark Office*